United States Patent [19]

Yamagata et al.

[11] Patent Number: 5,423,923
[45] Date of Patent: Jun. 13, 1995

[54] HARD FILM OF AMORPHOUS TI-SI ALLOY HAVING FINE TIN PARTICLES

[75] Inventors: Hiroshi Yamagata, Toyama; Tadashi Yamaguchi, Sendai; Hideki Takeda, Kawasaki; Nobuyuki Nishiyama, Tokyo; Katsutoshi Nozaki, Wako; Akihisa Inoue, 11-806, Kawauchijutaku, Mubanchi, Kawauchi Aoba-ku, Sendai-shi, Miyagi-ken; Tsuyoshi Masumoto, 3-8-22, Kamisugi, Aoba-ku, Sendai-shi, Miyagi-ken, all of Japan

[73] Assignees: Yoshida Kogyo K.K., Tokyo; Tsuyoshi Masumoto; Akihisa Inoue, both of Miyagi; Honda Motor Co., Ltd., Tokyo, all of Japan

[21] Appl. No.: 315,620

[22] Filed: Sep. 30, 1994

Related U.S. Application Data

[62] Division of Ser. No. 120,523, Sep. 14, 1993.

[30] Foreign Application Priority Data

Sep. 16, 1992 [JP] Japan .................. 4-270808

[51] Int. Cl.$^6$ .................. C22C 14/00; C22C 1/00; C22C 29/00
[52] U.S. Cl. .................. 148/421; 148/239; 148/403; 428/614; 428/627
[58] Field of Search .................. 148/421, 239, 403; 428/614, 627

[56] References Cited

U.S. PATENT DOCUMENTS

| | | | |
|---|---|---|---|
| 4,230,749 | 10/1980 | Patel | 427/423 |
| 4,623,408 | 11/1986 | Karamon et al. | 148/403 |
| 4,634,600 | 1/1987 | Shimizu et al. | 427/38 |
| 4,855,026 | 8/1989 | Sioshansi | 204/192.11 |
| 4,915,905 | 4/1990 | Kampe et al. | 420/590 |
| 4,916,030 | 4/1990 | Christodoulou et al. | 428/614 |
| 4,973,388 | 11/1990 | Francois et al. | 204/38.4 |
| 5,035,957 | 7/1991 | Bartlett et al. | 428/552 |
| 5,045,345 | 9/1991 | Singer | 427/38 |
| 5,149,381 | 9/1992 | Grewe et al. | 148/513 |

*Primary Examiner*—Upendra Roy
*Attorney, Agent, or Firm*—Hill, Steadman & Simpson

[57] ABSTRACT

Deposition of a hard film of Ti-Si-N composite material on a substrate is carried out by using a source of evaporation possessing a composition of $Ti_aSi_b$ (wherein "a" and "b" stand for atomic percentages respectively falling in the ranges of 75 at % $\leq a \leq$ 85 at % and 15 at % $\leq b \leq$ 25 at %, providing a+b=100 at %). Deposition is effected by a sputtering process or ion plating process in an atmosphere of an inert gas containing a nitrogen-containing reaction gas while controlling the feed rate of the reaction gas into a chamber in such a manner that the partial pressure of nitrogen is kept constant or varied continuously or stepwise. By this method there can be obtained a film having fine TiN crystalline particles uniformly dispersed in the matrix phase of Ti-Si amorphous metal or a film of functionally gradient structure in which the ratio of fine TiN crystalline particles dispersed in the matrix phase increases continuously or stepwise in the direction of thickness of the film.

4 Claims, 3 Drawing Sheets

5,423,923

HARD FILM OF AMORPHOUS TI-SI ALLOY HAVING FINE TIN PARTICLES

This is a division of application Ser. No. 08/120,523, filed Sep. 14, 1993.

BACKGROUND OF THE INVENTION

1. Field of the Invention

This invention relates to a hard film of Ti-Si-N composite material and, more particularly, to a hard film of Ti-Si-N composite material having fine TiN crystalline particles uniformly dispersed in the matrix phase of a Ti-Si amorphous metal. This invention further relates to a method for the production of the hard film of Ti-Si-N composite material.

2. Description of the Prior Art

The Ti-Si alloy is a material which is renowned for its marked lightness and high strength and is characterized by possessing a great ability to form an amorphous structure. This alloy whose hardness approximates to 300 Hk has the possibility of finding utility as a wear-resistant film as for coating resinous materials. From the practical point of view, however, it is desired to exhibit still higher hardness and, at the same time, good adhesiveness to a substrate.

SUMMARY OF THE INVENTION

The present invention, therefore, has an object of providing a hard film of Ti-Si-N composite material which is produced by having uniformly dispersed in an amorphous film fine ceramic particles possessing high hardness and, therefore, enabled to excel in adhesiveness to a substrate and exhibit high bending . strength and high hardness.

Another object of the present invention is to provide a hard film of Ti-Si-N composite material which is produced by dispersing fine ceramic particles in the matrix phase of an amorphous metal in such a manner as to form a film of a functionally gradient structure having the ratio of ceramic particle distribution increased in the direction of thickness of the film and, therefore, enabled to excel the Ti-Si alloy material in strength and, as a whole film, enjoy alleviation of the brittleness which constitutes itself the drawback of the ceramic material and acquire a surface of high hardness.

Yet another object of the present invention is to provide a method which enables a hard film of Ti-Si-N composite material possessing such outstanding properties as mentioned above to be formed on a substrate without requiring addition of a special step to the process of production.

To accomplish the objects described above, according to the present invention, there is provided a hard film of Ti-Si-N composite material which is characterized by having fine TiN crystalline particles dispersed in the matrix phase of an amorphous metal of a composition of $Ti_aSi_b$ (wherein "a" and "b" stand for atomic percentages respectively in the ranges of 75 at % $=a=85$ at % and 15 at % $\leq b \leq 25$ at %, providing $a+b=100$ at %). The hard film of Ti-Si-N composite material may be a film of a uniform composition having the fine TiN crystalline particles uniformly dispersed in the matrix phase of an amorphous metal throughout the entire volume thereof or a film of a functionally gradient structure in which the film is varied continuously or stepwise from the Ti-Si amorphous metal to the TiN crystalline ceramic with the ratio of the fine TiN crystalline particles dispersed in the matrix phase of the amorphous metal increases in the direction of thickness of the film.

Further in accordance with the present invention, there is provided a method for the production of the hard film of Ti-Si-N composite material, comprising the steps of setting in place a substrate and a material possessing a Composition of $Ti_aSi_b$ (wherein "a" and "b" have the same meanings as defined above) as a source of evaporation in a chamber and effecting deposition of the film having fine TiN crystalline particles dispersed in the matrix phase of Ti-Si amorphous metal on the substrate in an atmosphere of an inert gas containing a nitrogen-containing reaction gas.

Preferably the deposition of the aforementioned film on the substrate is carried out by a sputtering process or an ion plating process and the feed rate of the reaction gas into the chamber may be controlled in such a manner that a partial pressure of nitrogen is kept constant or varied continuously or stepwise. Nitrogen gas or $NH_3$ gas may be advantageously used as the reaction gas and their pressure is preferably controlled in the range of 0.03 to 0.06 Pa as the partial pressure of nitrogen.

BRIEF DESCRIPTION OF THE DRAWINGS

Other objects, features, and advantages of the invention will become apparent from the following description taken together with the drawings, in which.

DETAILED DESCRIPTION OF THE INVENTION

Figure 1:
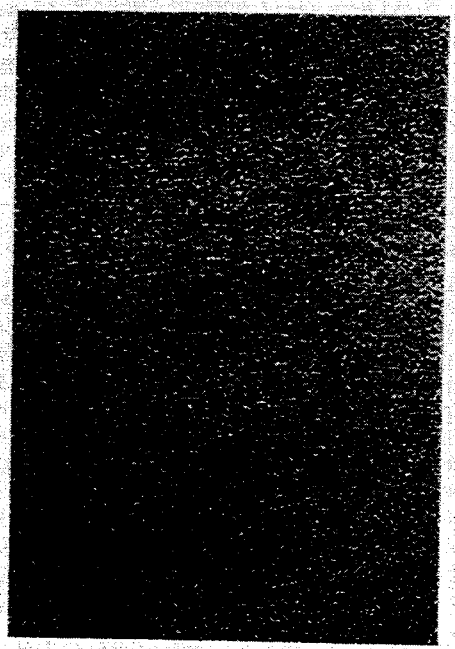
FIG. 1 is a micrograph taken through the transmission electron microscope (TEM) showing a bright-field image in 150,000 magnifications of a hard film of Ti-Si-N composite material produced in Example 1 to be described hereinafter.

The present invention, in the formation of a film on a substrate by the sputtering technique or the ion plating technique, is characterized by using as a target (material for evaporation) a Ti-Si material of a composition such as to produce an amorphous film in an atmosphere of an inert gas and allowing part of a specific component of the material evaporated to react with nitrogen as a reaction gas and give rise to a nitride and effect uniform dispersion of the nitride in the amorphous material.

To be specific, the film having the fine TiN crystalline particles dispersed in the matrix phase of Ti-Si amorphous metal is produced by setting in place a material possessing a composition of $Ti_aSi_b$ (wherein "a" and "b" stand for atomic percentages respectively in the ranges of 75 at % $\leq a \leq 85$ at % and 15 at % $\leq b \leq 25$ at %, providing $a+b=100$ at %) as a source of evaporation in a reaction chamber, feeding a nitrogen-containing reaction gas into the chamber, and effecting the deposition of the film on a substrate by the sputtering technique or the ion plating technique in the atmosphere of the inert gas containing a prescribed amount of the reaction gas. By using nitrogen gas or NH₃ gas as the reaction gas and selecting the partial pressure of nitrogen in the range of 0.03 to 0.06 Pa, preferably 0.04 to 0.05 Pa, the fine TiN crystalline particles precipitate in the matrix phase of Ti-Si amorphous metal. The total pressure of the inert gas and the reaction gas is desirably controlled in the range of 3 to 6 Pa and most favorably in the neighborhood of 5 Pa.

It has been confirmed by the thin film X-ray diffraction that the conversion of the thin Ti-Si-N film from the Ti-Si amorphous phase to the crystals occurs when the ratio of the partial pressure of nitrogen to the total pressure of the sputter gas is about 0.01% or more, indicating that a very small partial pressure of nitrogen suffices to effect the conversion of the amorphous phase to the crystalline particles. When the film which had already undergone the conversion from the amorphous phase to the crystalline phase was observed under a transmission electron microscope, it was found that extremely fine crystalline particles approximately 1 to 5 nm in diameter were dispersed with intervals of about 5 nm in the matrix phase of amorphous metal. This nanoparticle dispersion type amorphous gradient film was found to possess high hardness and high stability to crystallization.

As means for the aforementioned deposition, the sputtering process and the ion plating process may be cited. The source of evaporation may be a single source of evaporation using compounds or mixtures which contain necessary compositions. Where a plurality of sources of evaporation are simultaneously used, each of the sources of evaporation may be made of a material of a single composition or a combination of the aforementioned sources of evaporation.

The film to be formed may be made of a composition uniform throughout the entire volume thereof. Otherwise, the composition of the film may be varied continuously or stepwise in the direction of thickness of the film so that the composition of the part of the film being in contact with the substrate differs from that of the surface part of the film. Specifically, the film of a uniform composition having fine TiN crystalline particles dispersed uniformly in the matrix phase of Ti-Si amorphous metal throughout the entire volume thereof may be obtained by introducing an inert gas such as At, Be, Re, Xe, or Kr into a deposition chamber, keeping the total gas pressure therein at a low level in the range of 3 to 6 Pa, and feeding a reaction gas such as N₂ or NH₃ into the chamber with the feed rate controlled at a fixed level in the range of 0.03 to 0.06 Pa as partial pressure of nitrogen, namely in the neighborhood of 0.01% of the total pressure as described above. In contrast thereto, the film of a functionally gradient structure in which the ratio of fine TiN crystalline particles dispersed in the matrix phase of amorphous metal increases in the direction of the surface of the film and the conversion of the Ti-Si amorphous metal to the Ti-Si-N composite material containing TiN crystalline ceramic particles varies continuously or stepwise in the direction of thickness of the film may be obtained by controlling the feed rate of the reaction gas so that it varies continuously or stepwise.

As described in detail above, the method contemplated by the present invention enables a dense wear-resistant hard film of Ti-Si-N composite material exhibiting good adhesiveness to a substrate and having a surface of high hardness to be produced without requiring addition of any special step to the process of coating.

Since the hard film of Ti-Si-N composite material to be obtained by the present invention is a film of uniform composition having fine TiN crystalline particles uniformly dispersed in the matrix phase of Ti-Si amorphous metal or a film of functionally gradient structure in which the ratio of fine TiN crystalline particles dispersed in the matrix phase of Ti-Si amorphous metal increases in the direction of thickness of the film and the conversion of the Ti-Si amorphous metal to the Ti-Si-N composite material containing TiN crystalline ceramic particles varies continuously or stepwise in the direction of thickness of the film, the film exhibits outstanding properties such as excellent adhesiveness to the substrate, high bending strength, and high hardness. Since the hard film of Ti-Si-N composite material exhibits outstanding mechanical and electrical properties and, at the same time, enjoys alleviation of the brittleness which forms a drawback of ceramic material, it can be used as electric and electronic materials, high-strength materials, wear-resistant materials, and highly refractory materials and find extensive utility in numerous industrial fields.

Now, the present invention will be described more specifically below with reference to a working example.

Example 1:

A target made of an alloy of (85 at % Ti-15 at % Si) was set in place as opposed to an electrode (+pole) inside a magnetton sputter device and a substrate made of a glass plate to be subjected to deposition was disposed between the electrode and the target at a distance of 40 mm from the target. The sputter device was evacuated by means of a vacuum pump and then supplied with argon gas until the total gas pressure inside the device reached 1 Pa.

Preparatorily to the coating operation, a high-frequency power source was connected to a lie serving to fix the glass substrate in place and an electric power of 100 W was applied to the jig to effect sputter-etching of the glass substrate for 10 minutes.

Then, a DC power source was connected to the target and an electric current of 0.3 A was applied to the target 80 mm in diameter to effect preliminary discharge for 20 minutes. At this time, a stainless steel plate as a shutter was set in place in front of the glass substrate so as to prevent the glass substrate from coating due to the preliminary discharge mentioned above. This preliminary discharge had a purpose of removing the gas and moisture adhering to the surface of the target.

After this preliminary discharge was completed, the shutter was removed and the coating of the glass substrate was started. The substrate was not heated prior to the coating.

While the coating was in process, the partial pressure of nitrogen as a reaction gas was kept at a prescribed level between 0 Pa and 0.225 Pa by means of an electrically controllable flow rate adjusting meter to grow a film to a thickness of 20 μm over a period of 60 minutes.

Figure 4:
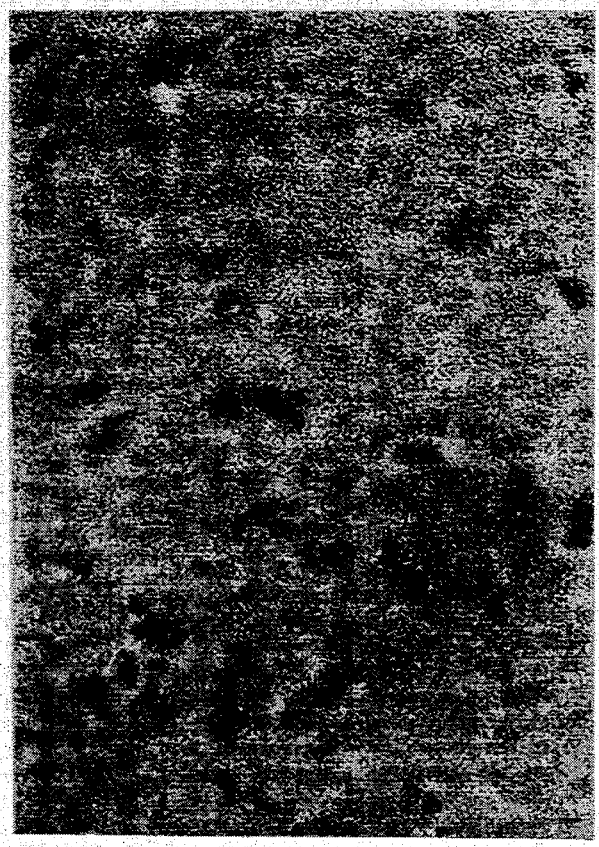
FIG. 4 is a transmission electron micrograph showing a TEM image in 1,200,000 magnifications of the same sample of the hard Ti-Si-N composite material as in FIG. 1.
Figure 2:
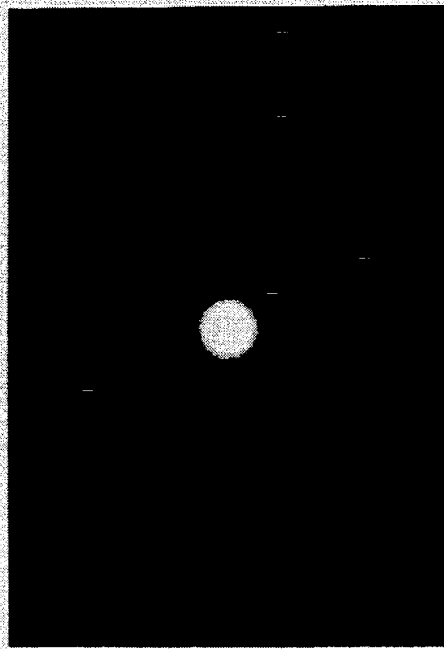
FIG. 2 is a transmission electron micrograph showing an electron diffraction image of the same sample of the hard film of Ti-Si-N composite material as in FIG. 1.
Figure 3:
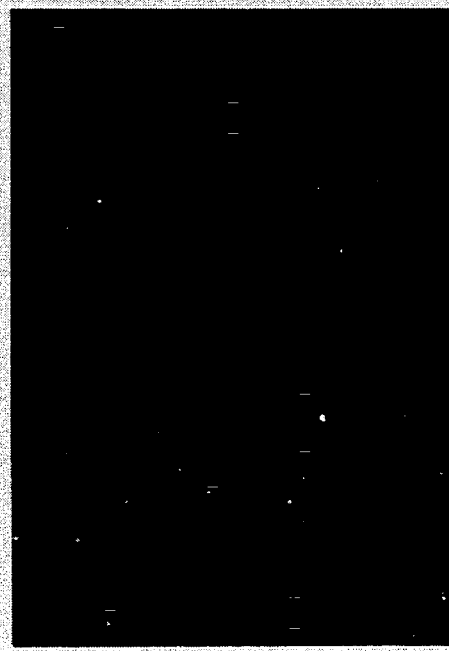
FIG. 3 is a transmission electron micrograph showing a dark-field image in 150,000 magnifications of the same sample of the hard film of Ti-Si-N composite material as in FIG. 1.

FIGS. 1 to 4 are transmission electron micrographs of the section of a thin hard film of Ti-Si-N composite material grown at a partial pressure of nitrogen of 0.04 Pa. FIG. 1 shows a bright-field image in 150,000 magnifications. FIG. 2 represents an electron diffraction image of the same sample as in FIG. 1. FIG. 3 shows a dark-field image in 150,000 magnifications of the same sample as in FIG. 1, clearly depicting the state of dispersion of fine crystals. FIG. 4 shows a TEM image in 1,200,000 magnifications of the same sample as in FIG. 1, clearly revealing sporadic collections of small lattice images and absence of a lattice image around the collections, which indicates uniform dispersion of fine crystals in an amorphous matrix. As clearly noted from these transmission electron micrographs, uniform dispersion of ceramic particles in an amorphous phase could be attained when the partial pressure of nitrogen was in the range of 0.04 Pa to 0.05 Pa.

Figure 5:
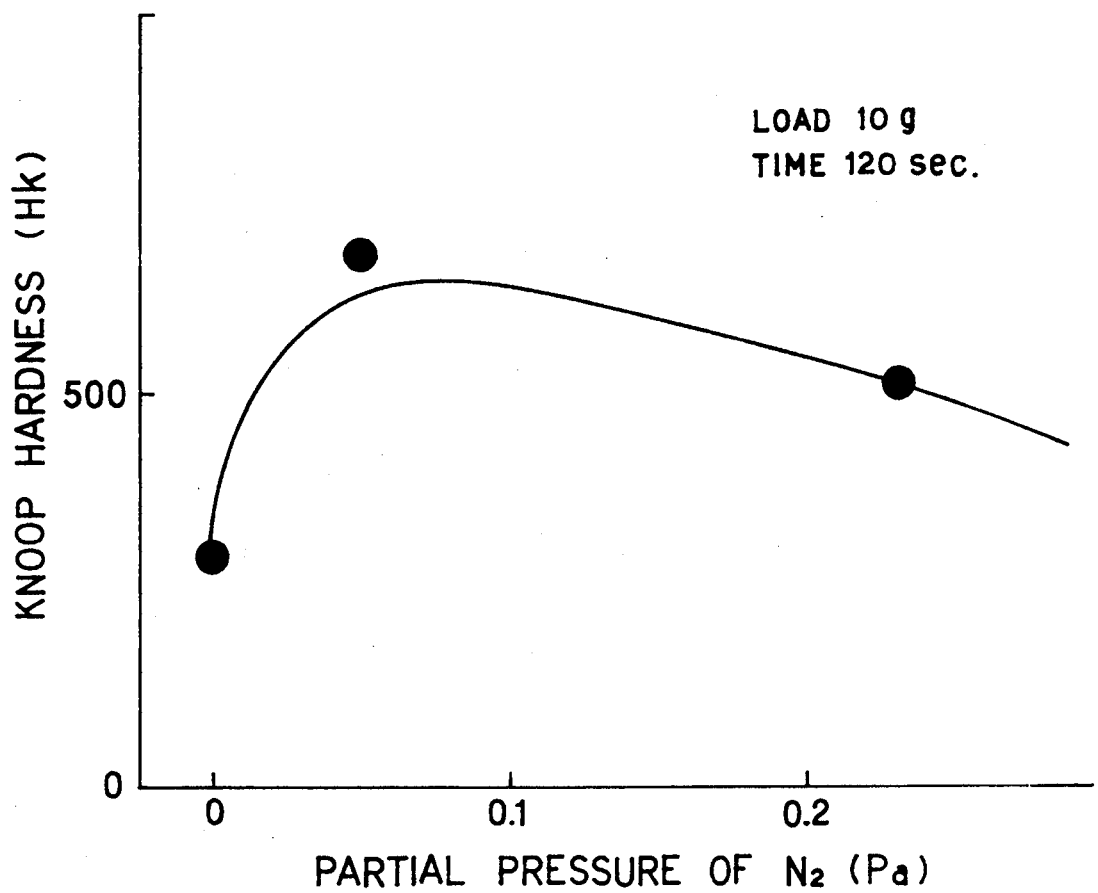
FIG. 5 is a graph showing the relation between the Knoop hardness of the hard film of Ti-Si-N composite material produced in Example 1 and the partial pressure of nitrogen.

FIG. 5 shows the Knoop hardness of the produced film. For the purpose of comparison, the values of hardness obtained of the films produced under the conditions of the partial pressures of nitrogen of 0 Pa and 0.225 Pa are also shown in the diagram. It is clearly noted from the results shown in FIG. 5 that the highest hardness was manifested when the ceramic particles were uniformly dispersed in the amorphous film. The comparative films which were wholly formed of ceramic crystals showed low values of hardness probably because of the brittleness of the ceramic film of this composition and the influence of the stress generated in the film during the growth of the film.

The invention may be embodied in other specific forms without departing from the spirit or essential characteristics thereof. The described embodiments are therefore to be considered in all respects as illustrative and not restrictive, the scope of the invention being indicated by the appended claims and all changes which come within the meaning and range of equivalency of the claims are, therefore, intended to be embraced therein.

What is claimed is:

1. A hard film of Ti-Si-N composite material characterized by having fine TiN crystalline particles dispersed in a matrix phase of an amorphous metal possessing a composition of $Ti_aSi_b$ (wherein "a" and "b" stand for atomic percentages respectively in the ranges of 75 at % $\leq$ a $\leq$ 85 at % and 15 at % $\leq$ b $\leq$ 25 at %, providing a+b=100 at %).

2. A hard film according to claim 1, wherein said film has a uniform composition having said fine TiN crystalline particles uniformly dispersed throughout the entire volume of said matrix phase of amorphous metal.

3. A hard film according to claim 1, wherein said film has a functionally gradient structure in which the ratio of said fine TiN crystalline particles dispersed in said matrix phase of amorphous metal increases continuously in the direction of thickness of the film.

4. A hard film according to claim 1, wherein said film has a functionally gradient structure in which the ratio of said fine TiN crystalline particles dispersed in said matrix phase of amorphous metal increases stepwise in the direction of thickness of the film.

* * * * *